(12) United States Patent
Yoshihara et al.

(10) Patent No.: US 8,228,744 B2
(45) Date of Patent: Jul. 24, 2012

(54) SEMICONDUCTOR MEMORY DEVICE HAVING SENSE AMPLIFIER

(75) Inventors: Masahiro Yoshihara, Yokohama (JP); Katsumi Abe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 265 days.

(21) Appl. No.: 12/693,798

(22) Filed: Jan. 26, 2010

(65) Prior Publication Data
US 2010/0188913 A1    Jul. 29, 2010

(30) Foreign Application Priority Data

Jan. 27, 2009  (JP) ................................ 2009-015700

(51) Int. Cl.
*G11C 7/10* (2006.01)
(52) U.S. Cl. ......... 365/189.08; 365/189.05; 365/230.03; 365/238.5
(58) Field of Classification Search ............. 365/189.08, 365/189.05, 230.03, 238.5
See application file for complete search history.

(56) References Cited

U.S. PATENT DOCUMENTS

| | | | |
|---|---|---|---|
| 5,963,475 A * | 10/1999 | Choi et al. ............... | 365/185.11 |
| 6,023,436 A * | 2/2000 | Han ............................ | 365/203 |
| 6,353,567 B1 * | 3/2002 | Huang et al. .............. | 365/203 |
| 6,377,507 B1 * | 4/2002 | Tsao ........................ | 365/230.03 |
| 6,414,880 B1 * | 7/2002 | Yabe et al. .............. | 365/189.05 |
| 6,438,038 B2 * | 8/2002 | Ikehashi et al. .......... | 365/185.24 |
| 6,614,715 B2 * | 9/2003 | Tsao et al. ................ | 365/238.5 |
| 6,842,377 B2 * | 1/2005 | Takano et al. ............ | 365/185.21 |
| 7,200,044 B2 * | 4/2007 | Won et al. ................ | 365/185.22 |
| 7,239,561 B2 * | 7/2007 | Park ........................ | 365/189.07 |
| 7,362,620 B2 * | 4/2008 | Yano et al. .............. | 365/189.05 |
| 7,495,963 B2 * | 2/2009 | Edahiro et al. .......... | 365/185.21 |
| 8,064,264 B2 * | 11/2011 | Shinozaki et al. ....... | 365/185.22 |

FOREIGN PATENT DOCUMENTS

JP    2007-213806    8/2007

* cited by examiner

*Primary Examiner* — Viet Q Nguyen
(74) *Attorney, Agent, or Firm* — Oblon, Spivak, McClelland, Maier & Neustadt, L.L.P.

(57) ABSTRACT

A semiconductor memory device includes a memory cell array, a page buffer, a data line pair, a differential amplifier and a precharger. The memory cell array includes a plurality of pages in which a plurality of memory cells are arranged. The page buffer is formed adjacent to the memory cell array, and includes a plurality of sense amplifiers configured to temporarily hold page data read from the memory cells in the page. The data line pair is arranged in the page buffer and is connected to the sense amplifiers. The differential amplifier is configured to amplify a potential difference between lines of the data line pair. The precharger is configured to precharge the data line pair to a predetermined potential. At least one of the differential amplifier and the precharger is formed in the page buffer, and the at least one circuit is electrically connected to the data line pair.

18 Claims, 16 Drawing Sheets

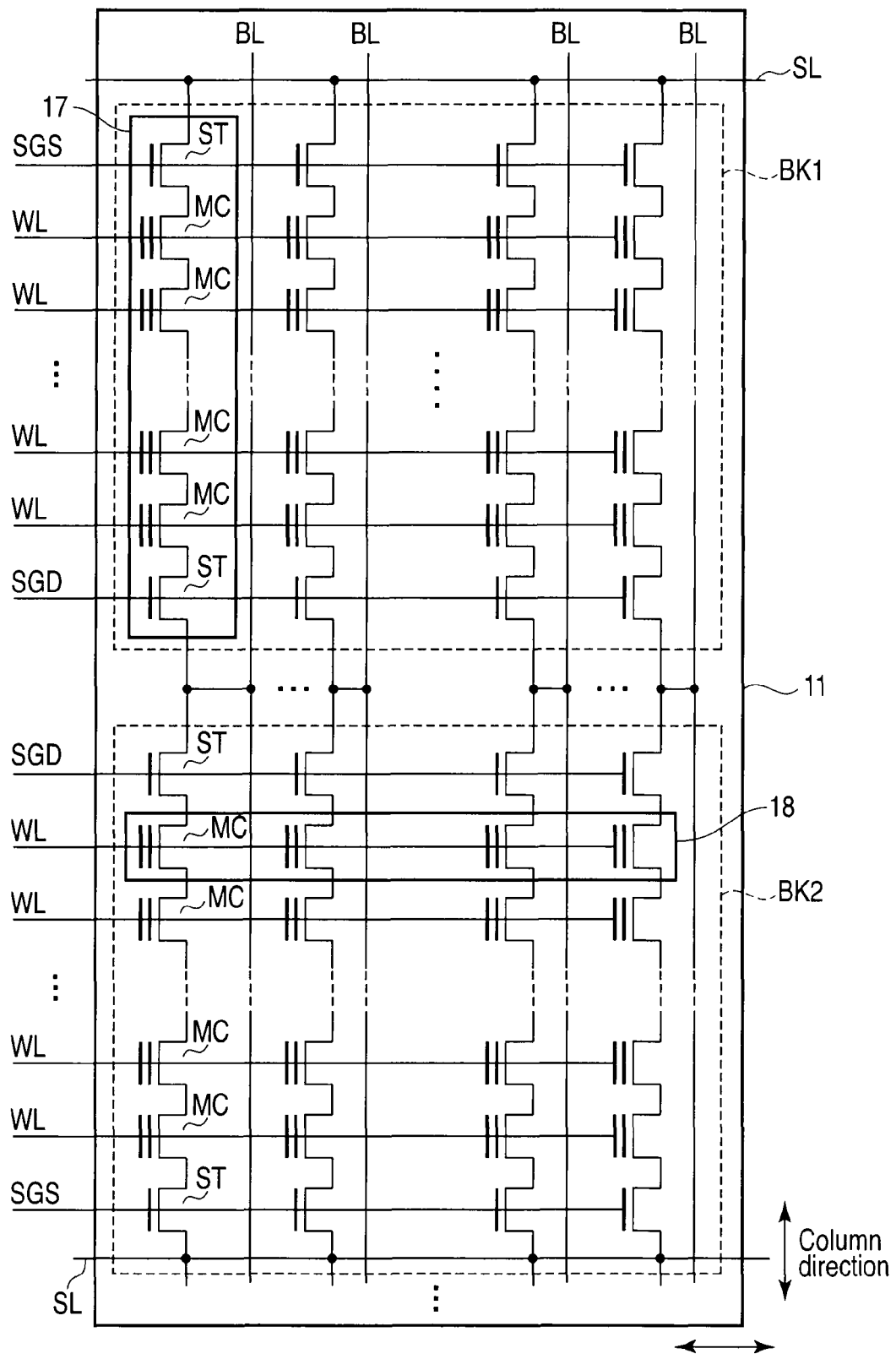
F I G. 3

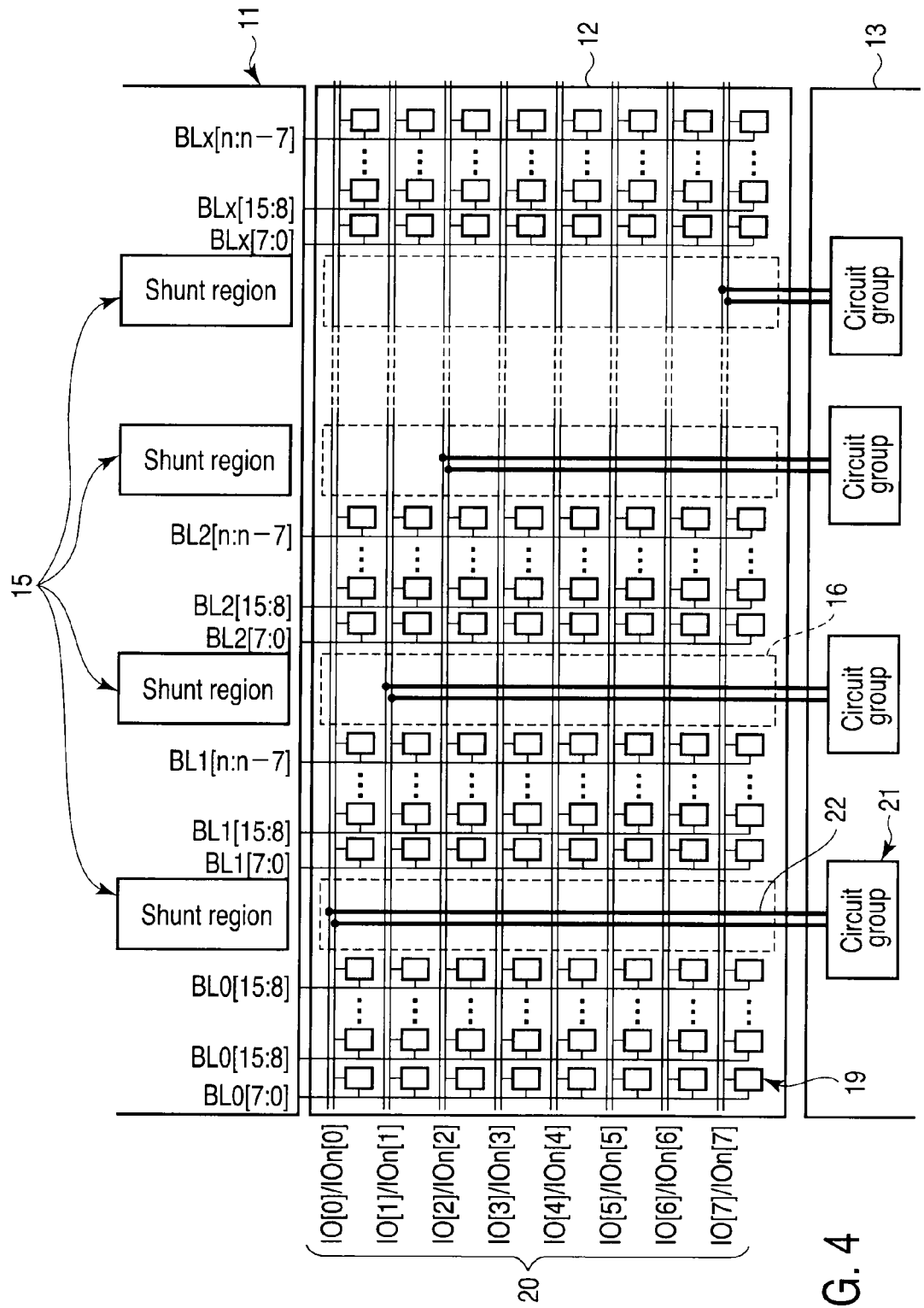
F I G. 4

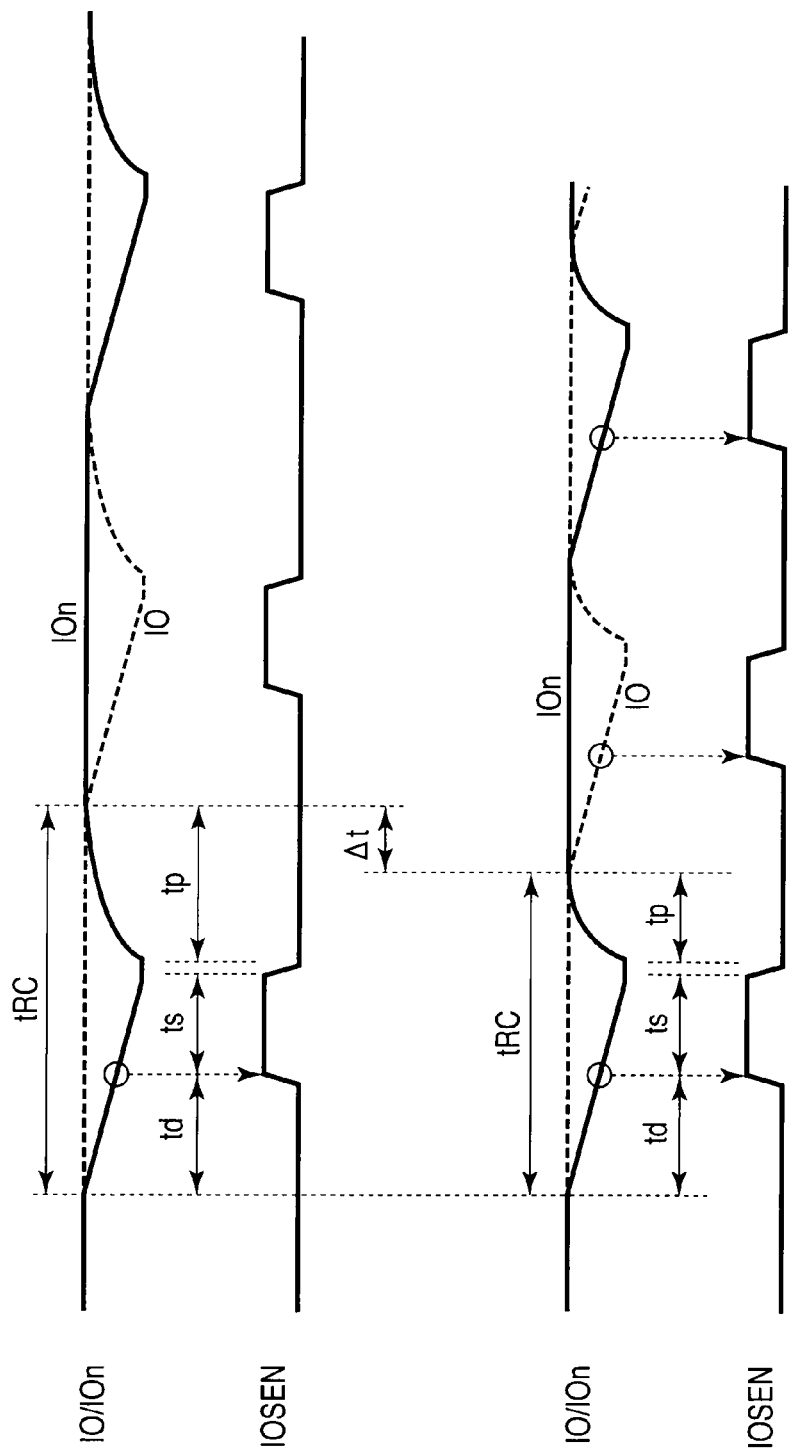

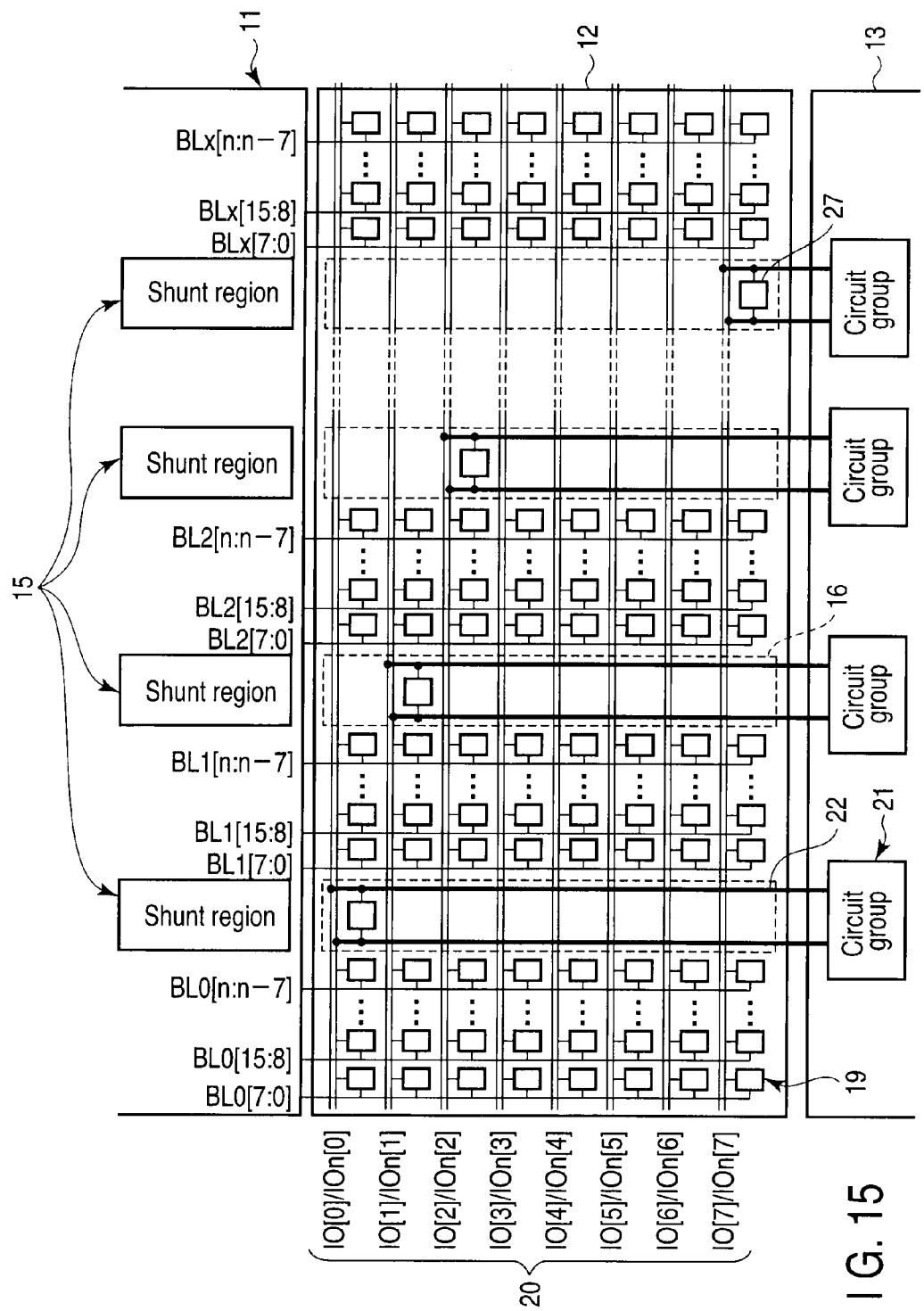
F I G. 15

SEMICONDUCTOR MEMORY DEVICE
// HAVING SENSE AMPLIFIER

CROSS-REFERENCE TO RELATED APPLICATIONS

This application is based upon and claims the benefit of priority from prior Japanese Patent Application No. 2009-015700, filed Jan. 27, 2009, the entire contents of which are incorporated herein by reference.

BACKGROUND OF THE INVENTION

1. Field of the Invention

The present invention relates to data input/output of a sense amplifier in a semiconductor memory device.

2. Description of the Related Art

A NAND flash memory is an example of semiconductor memories. Demands for this NAND flash memory are abruptly increasing as applications in which large volumes of data such as still images and motion images are processed in mobile apparatuses and the like increase. The size of a memory cell of the NAND flash memory shrinks for each generation in order to increase the memory capacity.

When the memory cell size shrinks, the bit line pitch also shrinks. Accordingly, the size is determined with respect to the bit line pitch, and a sense amplifier formed in a page buffer also shrinks (see, e.g., Jpn. Pat. Appln. KOKAI Publication No. 2007-213806). Consequently, the data line drivability of the sense amplifier degrades, so it takes a long time to obtain the total amplitude of a data line.

When reading data from the sense amplifier, therefore, a differential amplifier placed in a peripheral region amplifies data read to a data line, and transfers the amplification result to a read data line.

In addition, precharge and equalization are performed to prepare for the next read. A precharger and equalizer for performing these operations are also formed in the peripheral circuit.

That is, the differential amplifier, precharger, and equalizer to be used in data read are formed in the peripheral circuit. Therefore, the data line is extended to the peripheral region and electrically connected to these circuits.

Since the differential amplifier, precharger, and equalizer are formed in the peripheral circuit, a temporal delay occurs before the effects of these circuits propagate to the data line. This prolongs the time required to read data from the sense amplifier.

The time required to read data from the sense amplifier accounts for a high ratio in the data input/output time. Accordingly, the increase in time required to read data from the sense amplifier is a serious problem for a high speed required of a memory cell.

BRIEF SUMMARY OF THE INVENTION

According to a first aspect of the present invention, there is provided a semiconductor memory device comprising: a memory cell array comprising a plurality of pages in which a plurality of memory cells are arranged; a page buffer formed adjacent to the memory cell array, and comprising a plurality of sense amplifiers configured to temporarily hold page data read from the memory cells in the page; a data line pair arranged in the page buffer and connected to the sense amplifiers; a differential amplifier configured to amplify a potential difference between lines of the data line pair; and a precharger configured to precharge the data line pair to a predetermined potential. At least one of the differential amplifier and the precharger is formed in the page buffer, and said at least one circuit is electrically connected to the data line pair.

According to a second aspect of the present invention, there is provided a semiconductor memory device comprising: a memory cell array comprising a plurality of pages in which a plurality of memory cells are arranged; a page buffer formed adjacent to the memory cell array, and comprising a plurality of sense amplifiers configured to temporarily hold page data read from the memory cells in the page; a first data line pair arranged in the page buffer, connected to the sense amplifiers, and running in a first direction; a second data line pair connected to the first data line pair and running in a second direction perpendicular to the first direction; a differential amplifier configured to amplify a potential difference between lines of the first data line pair; and a precharger configured to precharge the first data line pair to a predetermined potential. At least one of the differential amplifier and the precharger is formed in the page buffer, and said at least one circuit is electrically connected to the second data line pair.

BRIEF DESCRIPTION OF THE SEVERAL VIEWS OF THE DRAWING

FIG. 3 is an equivalent circuit diagram of a cell array region;

FIG. 4 is a view showing the configuration of the page buffer, the memory cell array, and a peripheral circuit;

FIGS. 9A and 9B are timing charts of a first data line pair;

FIG. 15 is a view showing the configuration of the page buffer, memory cell array, and peripheral circuit.

DETAILED DESCRIPTION OF THE INVENTION

The best mode for carrying out embodiments of the present invention will be explained in detail below with reference to the accompanying drawing.

1. OUTLINE

In the embodiments of the present invention, the time required to read data from a sense amplifier is shortened by reducing an interconnect delay between a data line formed in a page buffer and a differential amplifier, precharger, and equalizer arranged in a peripheral circuit. For this purpose, at least one of the differential amplifier, precharger, and equalizer is formed in a shunt extension region in the page buffer, and the circuit formed in the shunt extension region is electrically connected to a data line pair.

In a practical example, a precharger is formed in each shunt extension region, and control is performed to drive all the prechargers when performing precharge. This reduces the precharge time when reading data from a sense amplifier.

2. EMBODIMENTS

Embodiments will be explained below by taking a NAND flash memory as an example.

(1) Overall View

Figure 1:
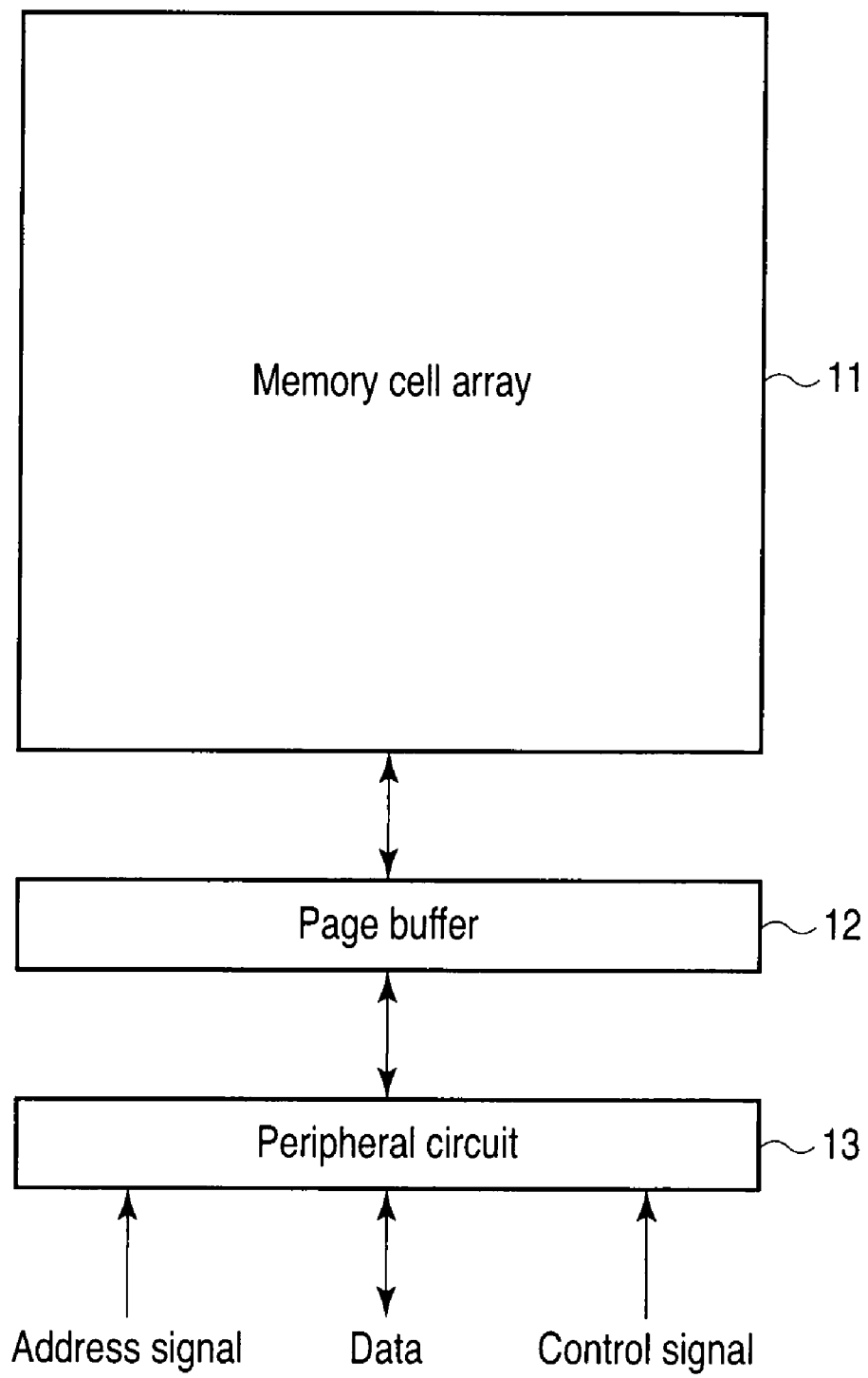
FIG. 1 is a block diagram showing an overall NAND flash memory.

FIG. 1 is a block diagram showing the whole of the NAND flash memory.

A memory cell array 11 includes a plurality of blocks. Each of the plurality of blocks includes a plurality of pages each including a plurality of memory cells.

A page buffer 12 includes a plurality of sense amplifiers corresponding to one page. The sense amplifiers sense page data read from the memory cells.

A peripheral circuit 13 is a region where random circuits such as a controller, substrate voltage controller, voltage generator, I/O buffer, and address buffer are arranged.

(2) Memory Cell Array & Page Buffer

Figure 2:
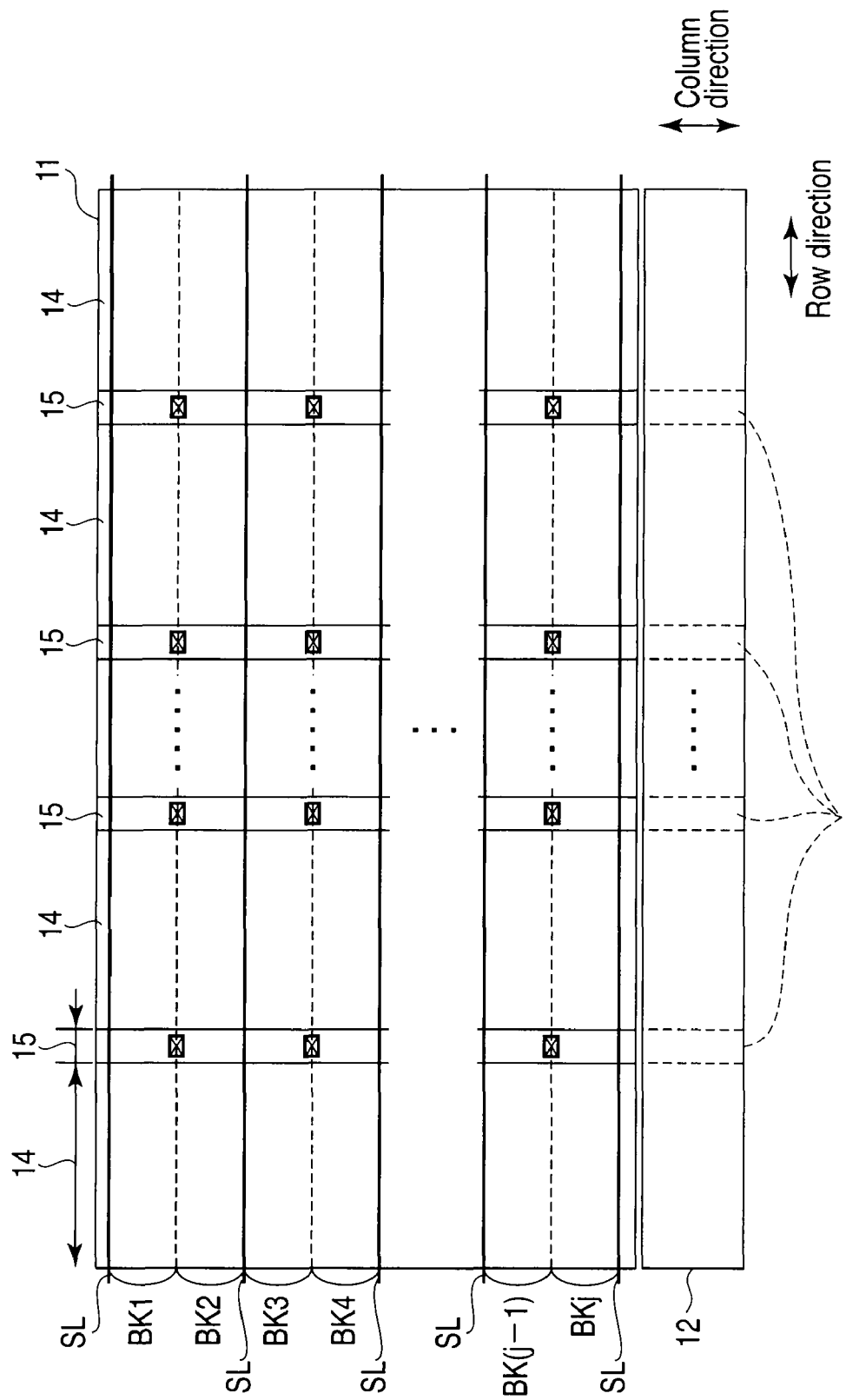
FIG. 2 is a view showing the layout of a memory cell array and page buffer.

FIG. 2 shows the layout of the memory cell array 11 and page buffer 12.

In the memory cell array 11, cell array regions 14 are arranged along the row direction.

Source lines SL running in the row direction are arranged at predetermined intervals on the cell array regions 14. Two blocks BKj (j=1, 2, 3, . . . ) are formed between the source lines SL.

Also, shunt regions 15 extending in the column direction are arranged at, e.g., predetermined intervals between the cell array regions 14. The shunt region 15 is a region formed to obtain contacts with regions such as a well region and source region in a semiconductor substrate.

The page buffer 12 is formed at the end portion in the column direction of the memory cell array 11.

Shunt extension regions 16 are formed in regions obtained by extending the shunt regions 15 to the page buffer 12 along the column direction.

The cell array region 14 is formed to have a layout as shown in, e.g., FIG. 3.

The cell array region 14 has a plurality of word lines WL and a plurality of selection gate lines SGS and SGD running in the row direction, and a plurality of bit lines BL running in the column direction.

Memory cells MC are arranged at the intersections of the word lines WL and bit lines BL. In addition, selection gate transistors ST are formed at the intersections of the bit lines BL and selection gate lines SGS and SGD.

A plurality of memory cells MC are arranged along the column direction, and the selection gate transistors ST are arranged to sandwich the memory cells MC. A plurality of memory cells MC and a plurality of selection gate transistors ST form a cell unit 17.

A plurality of cell units 17 are arranged at predetermined intervals in the row direction and column direction. The cell units 17 each have one end connected to the source line SL, and the other end connected to the bit line BL.

A plurality of memory cells MC connected together to a certain word line WL and simultaneously selected by the same row address form a page 18. The page 18 is the processing unit of data read and write. Data read or write is performed at once for each page.

A comparative example corresponding to the embodiments will be explained below with reference to FIGS. 4 to 7.

FIG. 4 shows a configuration example of a page buffer 12 and portions of a memory cell array 11 and peripheral circuit 13 of the comparative example.

The page buffer 12 has sense amplifiers 19 equal in number to memory cells contained in one page. Also, the page buffer 12 electrically connects bit lines BL running from the memory cell array 11 to first data line pairs 20 via the sense amplifiers 19.

The sense amplifier 19 includes a circuit that amplifies data on a bit line and holds the amplified data. The sense amplifier 19 further includes a transfer circuit that connects the sense amplifier 19 to the first data line pair 20 based on a signal supplied from a column decoder.

The first data line pair 20 includes data input/output lines IO/IOn (n=0, 1, 2, . . . , 7).

Circuit groups 21 formed in the peripheral circuit 13 each include a differential amplifier, read data line, precharger, and equalizer. The differential amplifier amplifies data read to a data line pair. The read data line outputs the data amplified by the differential amplifier. The precharger precharges the data line pair to a predetermined potential. The equalizer electrically connects the lines of the data line pair.

Second data line pairs 22 are electrically connected to the first data line pairs 20 in shunt extension regions 16 in the page buffer 12. Furthermore, in the peripheral circuit 13, the second data line pair 22 is electrically connected to the circuit group 21 including the differential amplifier, precharger, and equalizer.

The operation of reading data from the sense amplifier 19 will be explained below with reference to FIGS. 5 and 6.

Figure 5:
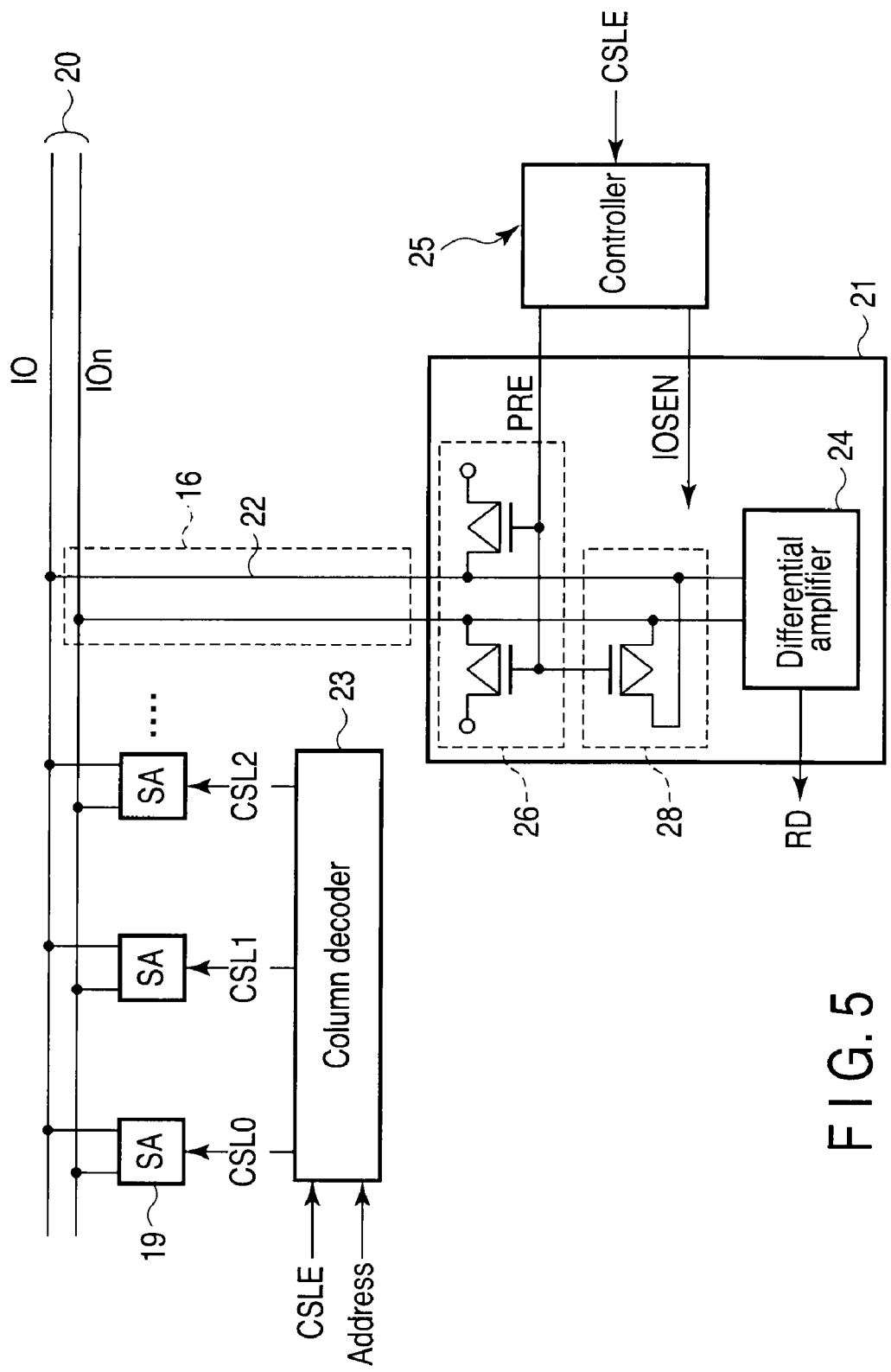
FIG. 5 is a view showing the configuration of the periphery of data lines.

FIG. 5 shows the configuration of a column decoder 23, the sense amplifiers 19 in the page buffer, the first data line pair 20, the second data line pair 22, a precharger 26, an equalizer 28, a differential amplifier 24, and a controller 25. The controller 25 controls the differential amplifier 24, precharger 26, and equalizer 28.

Figure 6:
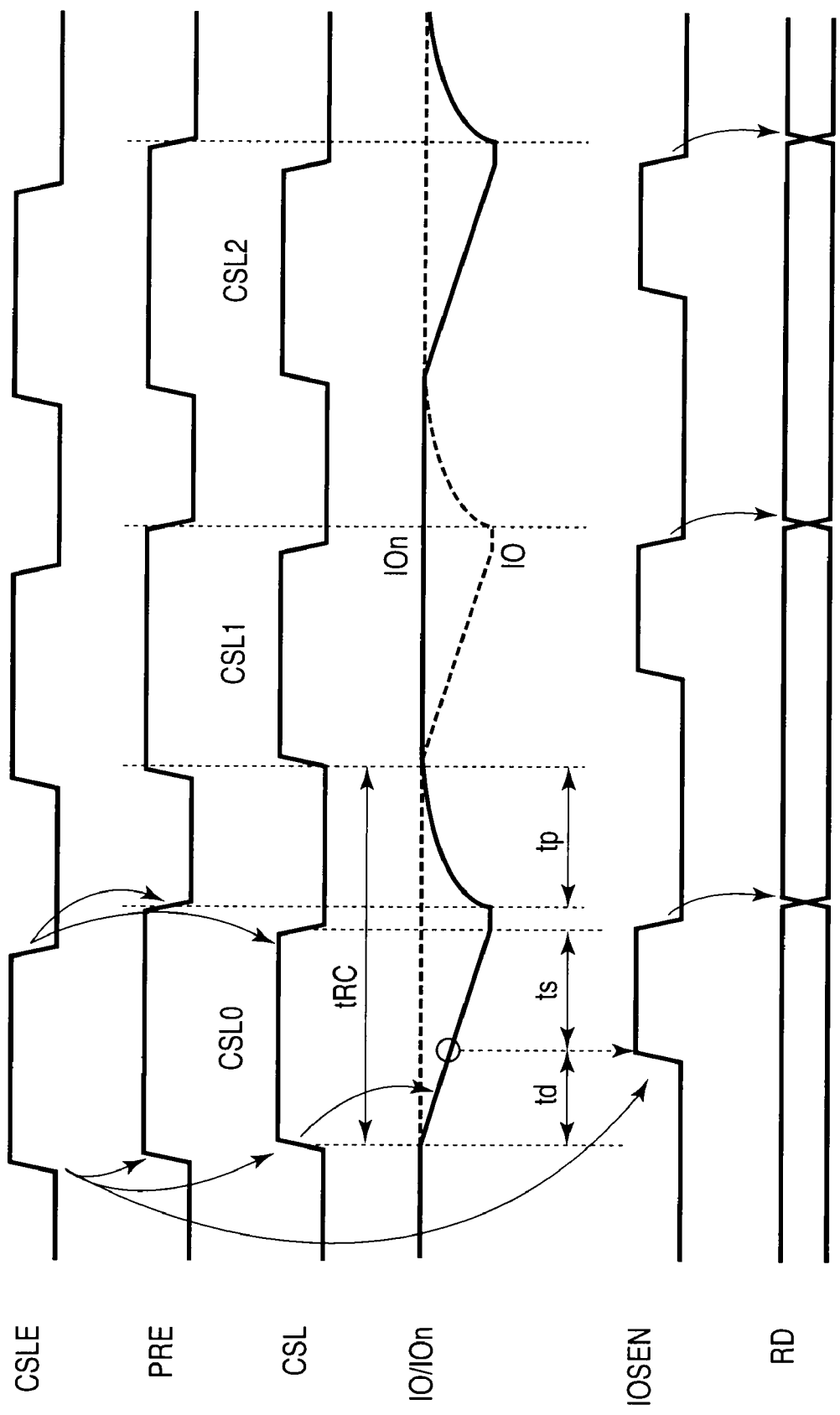
FIG. 6 is a timing chart of the operation of reading data from a sense amplifier.

FIG. 6 is a timing chart of the operation of reading data from the sense amplifier 19.

First, a column address signal and signal CSLE are supplied to the column decoder 23, and signal CSLE is supplied to the controller 25. Based on the column address signal, the column decoder 23 selects one of the plurality of bit lines. Based on signal CSLE, the controller 25 outputs a precharge signal PRE for controlling the precharger 26 and equalizer 28, and an activation signal IOSEN for controlling the differential amplifier 24.

When receiving signal CSLE, the controller 25 makes precharge signal PRE supplied to the precharger 26 high. When precharge signal PRE goes high, the precharger 26 is turned off.

After that, a signal CSLj (j satisfies j=0, 1, . . . , N−1 where N is the number of memory cells of one page) decoded by the column decoder 23 is made high, and the sense amplifiers 19 connected to the same bit line in the page buffer 12 are selected. In this manner, data of the sense amplifiers 19 are read to the respective corresponding data line pairs 20.

Then, the controller 25 supplies activation signal IOSEN to the differential amplifier 24 with a delay by which a desired potential difference appears between the lines of the data line pair 20 after the reception of signal CSLE. For example, activation signal IOSEN is supplied to the differential amplifier 24 when a potential difference of 100 mV is produced between the lines of the data line pair 20. The differential amplifier 24 amplifies the potential difference between the lines of the data line pair 20 to a MOS level, and outputs the result to a read data line RD.

After that, signal CSL goes low, and precharge signal PRE goes low. Consequently, the precharger 26 and equalizer 28 are turned on to perform precharge until the potential of the data line pair 20 becomes a desired potential.

The time required to produce a potential difference of 100 mV between the lines of the data line pair 20 after signal CSL decoded by the column decoder 23 goes high is defined as a data extraction time td, the period during which activation signal IOSEN of the differential amplifier 24 is high is defined as a sense time ts, and the period during which precharge signal PRE is low is defined as a precharge time tp.

The sum of the data extraction time td, sense time ts, and precharge time tp must be less than or equal to a read cycle time tRC. This is so because if signal CSL of the next cycle is supplied while precharge is incomplete, the log remains on the data line pair 20, and no correct data can be sensed any longer.

Figure 7:
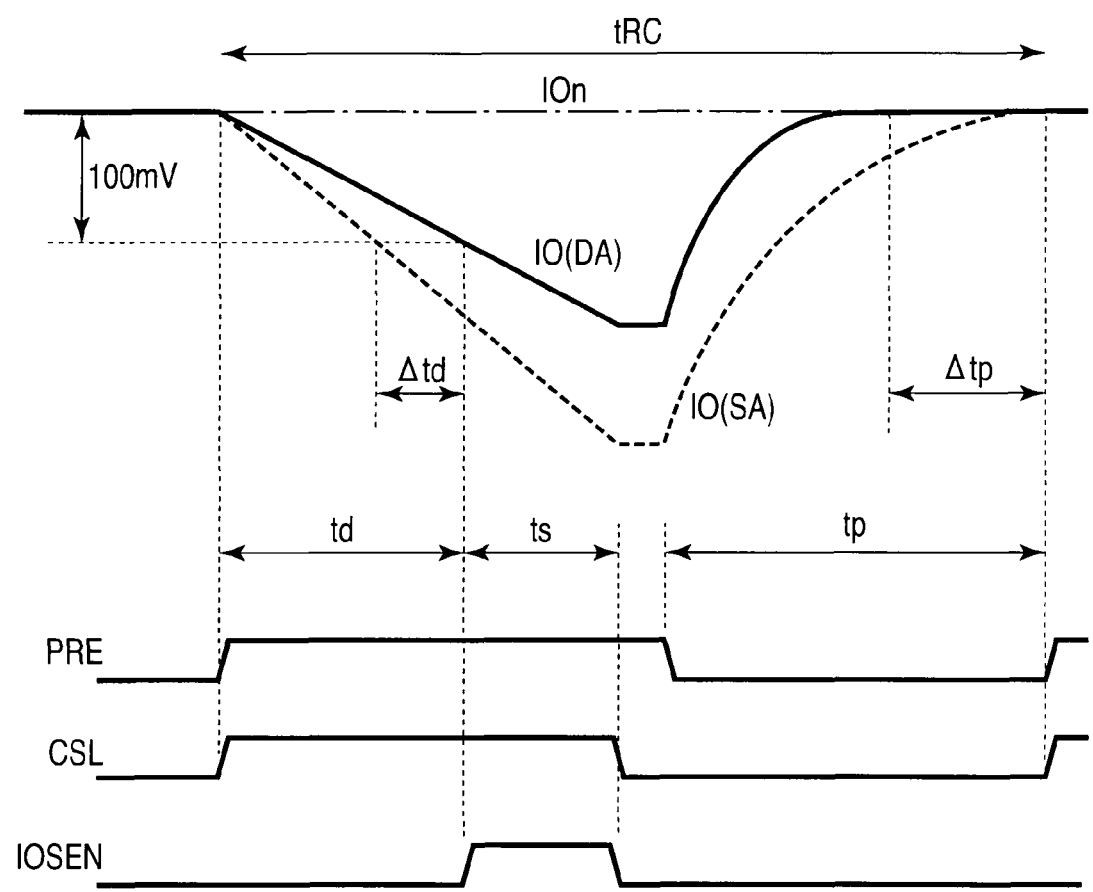
FIG. 7 is a view showing the influence of the parasitic resistance and parasitic capacitance of a data line pair on the read cycle time.

FIG. 7 shows the influence of the parasitic resistance and parasitic capacitance of the data line pair 20 on the read cycle time tRC. The explanation will be made by assuming that the data polarity is low.

When signal CSL goes high, the data line IO (SA) near the sense amplifier 19 starts discharging. However, the data line IO (DA) near the differential amplifier 24 can discharge with only a slope gentler than that of the data line IO (SA) owing to the influence of the interconnect delay. When the activation timing of the differential amplifier 24 is defined by a potential difference of 100 mV, the data extraction time td can be reduced by a time Δtd if no interconnect delay exists.

Furthermore, when precharge signal PRE goes low, the data line pair 20 starts precharging. Since the precharger 26 and equalizer 28 are arranged close to the differential amplifier 24, the data line IO (DA) is precharged first. However, it takes a long time to precharge the data line IO (SA) owing to the influence of the interconnect delay. If no interconnect delay exists, the precharge time tp can be reduced by time Δtp.

In recent NAND flash memories, the length of the first data line pair 20 increases because the page size increases. Also, since the pitch of the bit lines BL shrinks, page buffers are laid out as they are vertically stacked. This increases the length of the second data line pair 22 formed in the shunt extension region 16. Accordingly, the interconnect delay of the data lines tends to increase as a whole.

As described above, the influence of the interconnect delay prolongs both the data extraction time and precharge time, and makes it difficult to reduce the read cycle time tRC.

(3) First Embodiment

Figure 8:
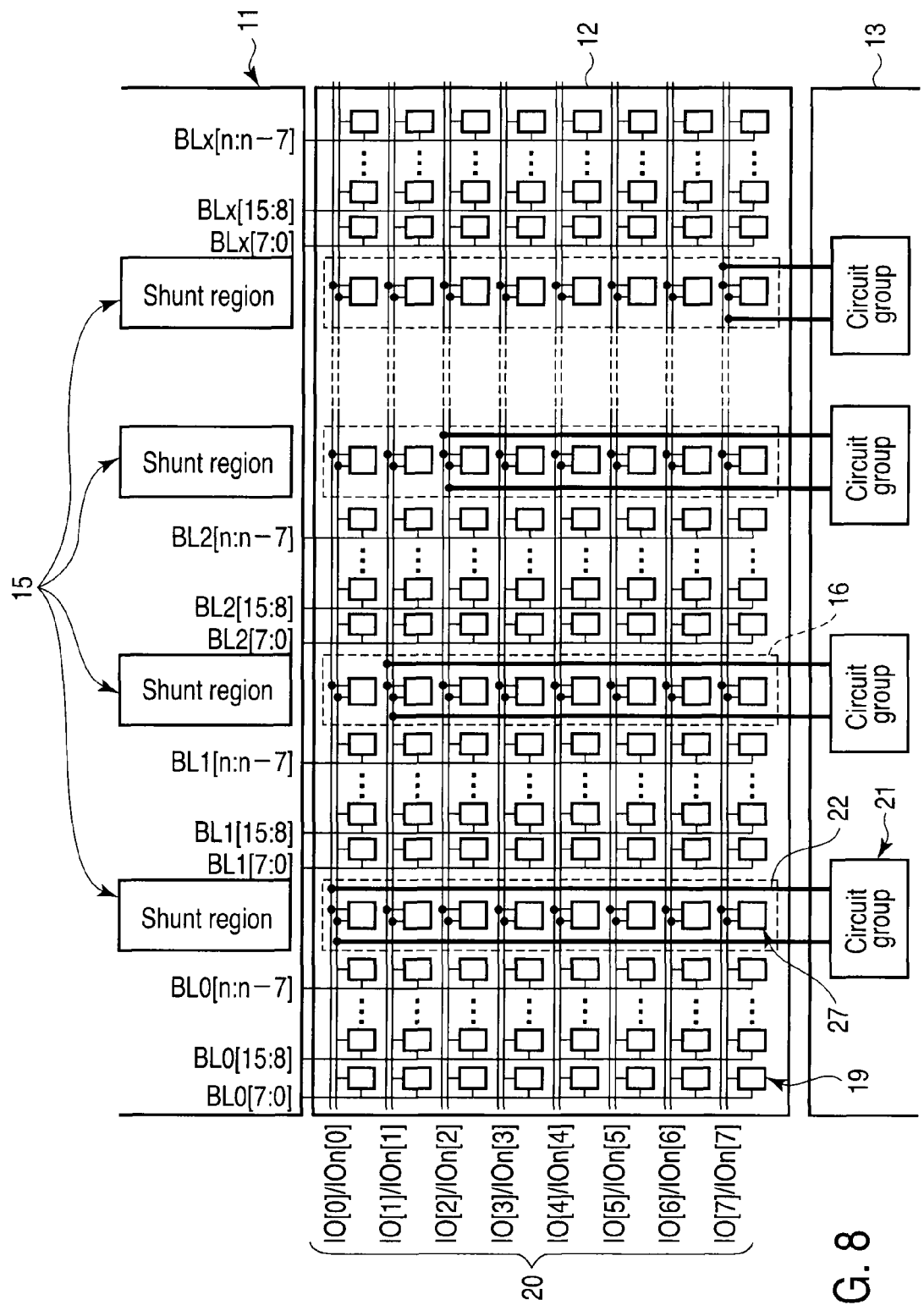
FIG. 8 is a view showing the configuration of the page buffer, memory cell array, and peripheral circuit.

FIG. 8 is a view showing a page buffer 12 and portions of a memory cell array 11 and peripheral circuit 13 according to the first embodiment.

The first embodiment is characterized in that at least one of a differential amplifier, precharger, and equalizer is formed in a circuit formation portion 27 in a shunt extension region 16 of the page buffer 12, and the circuit formation portion 27 and a first data line pair 20 are electrically connected. That is, a differential amplifier 24, precharger 26, and equalizer 28 formed in a circuit group 21 in the above-mentioned comparative example are formed in the circuit formation portion 27 as needed.

Since this reduces the distance between the first data line pair 20 and the differential amplifier 24, precharger 26, and equalizer 28, it is possible to suppress the delay of the time during which the amplification of a signal or precharge propagates to the first data line pair 20.

Also, when forming a second data line pair 22 in the shunt extension region 16, the first data line pair 20 is formed by using a low-resistance material, so it is sometimes necessary to use a high-resistance material as the second data line pair 22. Furthermore, the line width of the second data line pair 22 must be decreased because the shunt extension region 16 is narrow. As a consequence, the resistance of the second data line pair 22 rises.

In the first embodiment, however, the differential amplifier 24, precharger 26, and equalizer 28 are formed in the circuit formation portion 27 in the shunt extension region 16, and electrically connected directly to the first data line pair 20. Accordingly, the first embodiment also has the characteristic that the influence of the resistance of the second data line pair 22 can be reduced.

In the first embodiment as described above, at least one of the differential amplifier 24, precharger 26, and equalizer 28 is formed in the circuit formation portion 27 in the shunt extension region 16 of the page buffer 12, and the circuit in the circuit formation portion 27 is electrically connected to the first data line pair 20. This increases the speed of the operation of reading data from a sense amplifier 19. In addition, it is possible to read data from the sense amplifier 19 and precharge the data line pair 20 within the read cycle time tRC.

Practical examples of the layout of the circuit formation portion 27 will be explained below.

(A) First Example

In the first example, the precharger 26 and equalizer 28 are formed in the circuit formation portion 27 in all the shunt extension regions 16, and electrically connected to the first data line pair 20. The rest of the circuit is formed in the circuit group 21 of the peripheral circuit 13.

FIG. 9A is a timing chart for the first data line pair 20 when forming the precharger 26 and equalizer 28 in the circuit group 21. FIG. 9B shows a timing chart for the first data line pair 20 when forming the precharger 26 and equalizer 28 in the circuit formation portion 27 in all the shunt extension regions 16 of the page buffer 12.

As shown in FIGS. 9A and 9B, when forming the precharger 26 and equalizer 28 in the circuit formation portion 27, the precharge time tp is reduced by time Δt compared to that when forming the precharger 26 and equalizer 28 in the circuit group 21.

Also, the precharger 26 is preferably formed in the peripheral circuit 13 in addition to the precharger 26 formed in the shunt extension region 16 of the page buffer 12. By thus forming the prechargers 26 not only in the page buffer 12 but also in the peripheral circuit 13, it is possible to further reduce the influence of the resistance of the second data line pair 22, and further reduce the precharge time.

In this arrangement, a controller 25 performs control such that all the prechargers 26 formed in the shunt extension region 16 and the precharger 26 formed in the peripheral circuit 13 are turned on at the same time the equalizer 28 is turned on. By forming the prechargers 26 not only in the shunt extension region 16 but also in the peripheral circuit 13, the data line pair can be precharged faster than when the data line pair is precharged by one precharger.

Furthermore, the potential variation resulting from the position of the first data line pair 20 can be suppressed because the precharger 26 is formed in each shunt extension region 16, and all the prechargers 26 are turned on.

(B) Second Example

In the second example, the differential amplifier 24 is formed in the circuit formation portion 27 in all the shunt extension regions 16, and electrically connected to the first data line pair 20. The rest of the circuit is formed in the circuit group 21 of the peripheral circuit 13.

Figures 10A, 10B:
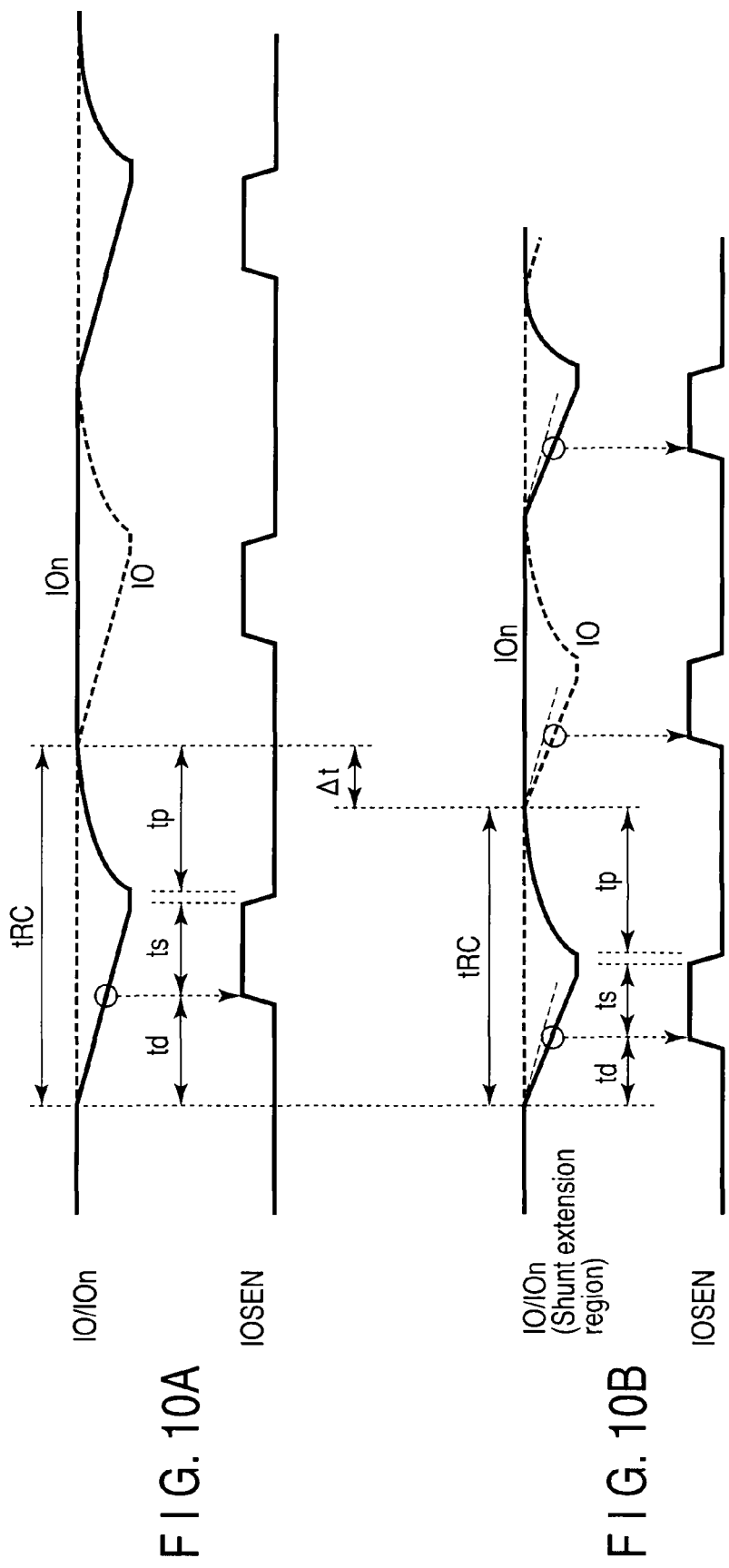
FIGS. 10A and 10B are timing charts of the first data line pair.

FIG. 10A is a timing chart for the first data line pair 20 when forming the differential amplifier 24 in the circuit group 21. FIG. 10B is a timing chart for the first data line pair 20 when forming the differential amplifier 24 in the circuit formation portion 27 in the shunt extension region 16 of the page buffer 12.

As shown in FIGS. 10A and 10B, when forming the differential amplifier 24 in the circuit formation portion 27, the data extraction time td and sense time is are reduced by time Δt compared to those when forming the differential amplifier 24 in the circuit group 21.

Since the circuit formation portion 27 is closer to the first data line pair 20 than the circuit group 21, the potential difference between a pair of data lines IO and IOn shown in FIG. 10B reaches a desired value at a timing earlier than that shown in FIG. 10A. This makes it possible to advance the timing of an activation signal IOSEN for activating the differential amplifier 24, and reduce the data extraction time td. In addition, the sense time is simultaneously reduced because the slope of the data line IO is larger than that shown in FIG. 10A during the amplification period.

Also, the differential amplifier 24 is preferably formed in the peripheral circuit 13 in addition to the differential amplifier 24 formed in the shunt extension region 16 of the page buffer 12. In this arrangement, the controller 25 performs control such that all the differential amplifiers 24 formed in the shunt extension region 16 and the differential amplifier 24 formed in the peripheral circuit 13 are turned on at the same time the precharger 26 and equalizer 28 are turned off. By thus forming the differential amplifiers 24 not only in the shunt extension region 16 but also in the peripheral circuit 13, data read to the data line pair 20 can be amplified faster than when the data is amplified by one differential amplifier.

(C) Third Example

Figure 11:
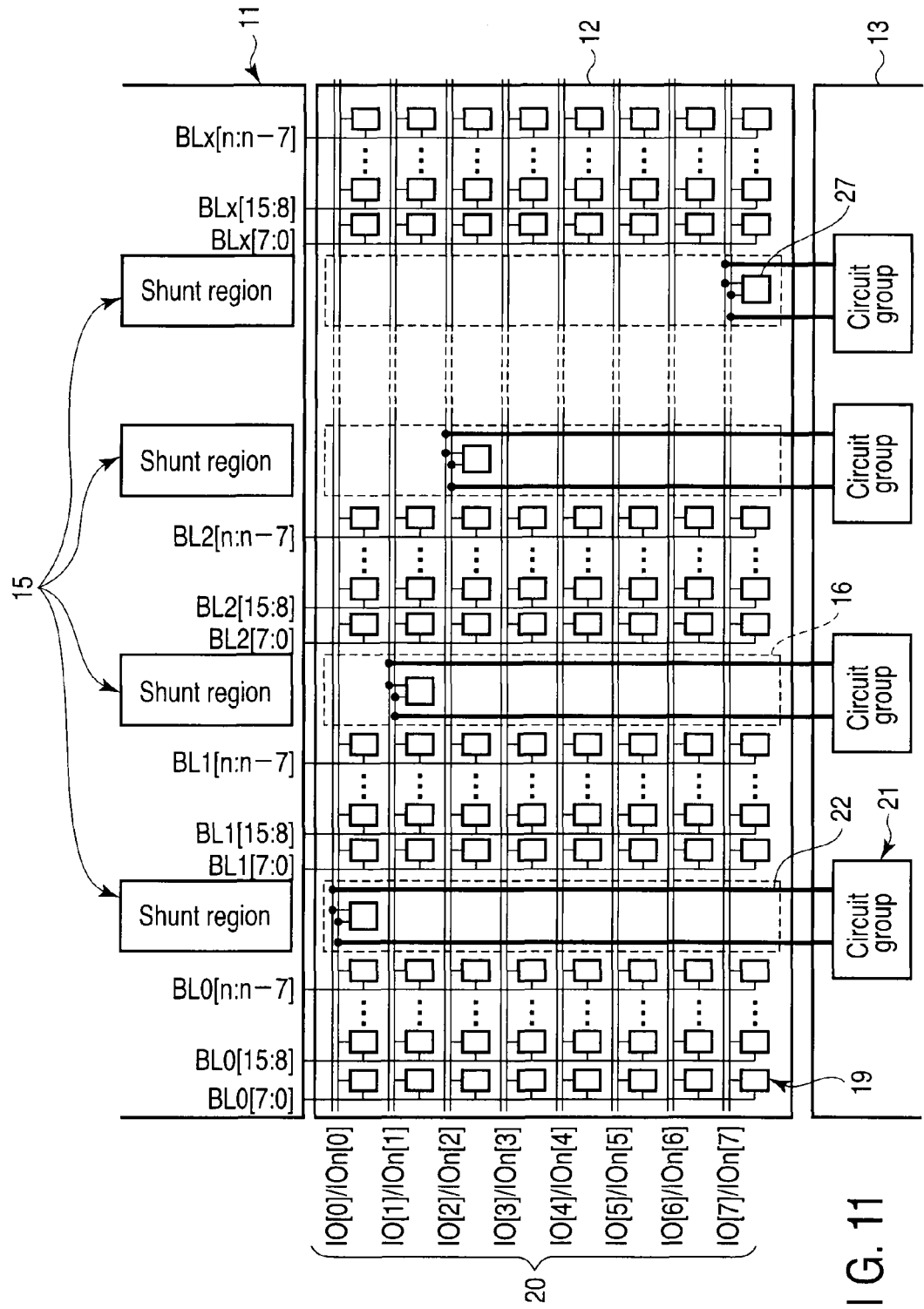
FIG. 11 is a view showing the configuration of the page buffer, memory cell array, and peripheral circuit.

In the third example as shown in FIG. 11, only one of the differential amplifier 24, precharger 26, and equalizer 28 is formed in the circuit formation portion 27 in the shunt extension region 16 with respect to one first data line pair 20. This arrangement will be described below.

The embodiment of the present invention is characterized in that one of the differential amplifier 24, precharger 26, and equalizer 28 formed in the circuit group 21 of the peripheral circuit 13 is formed in the circuit formation portion 27 in the shunt extension region 16 of the page buffer 12.

The read cycle time tRC is reduced even when only one of the differential amplifier 24, precharger 26, and equalizer 28 is formed in the shunt extension region 16 with respect to one first data line pair 20.

(D) Summary

As still another example, different types of circuits may also be formed in the circuit formation portions 27 in the shunt extension regions 16. For example, the differential amplifier 24 and a pair of the precharger 26 and equalizer 28 are alternately formed in the shunt extension regions 16. In this case, both the sense time and precharge time can be reduced.

In addition, although the equalizer is formed in the first embodiment, it is also possible to form no equalizer.

In the first embodiment, at least one of the differential amplifier 24, precharger 26, and equalizer 28 formed in the circuit group 21 of the peripheral circuit 13 is formed in the circuit formation portion 27 in the shunt extension region 16 of the page buffer 12, and the circuit formed in the circuit formation portion 27 is electrically connected to the first data line pair 20.

Consequently, the distance between the first data line pair 20 and the differential amplifier 24 or the precharger 26 and equalizer 28 is reduced. Accordingly, it is possible to suppress the delay of the time during which the amplification of a signal or precharge propagates to the first data line pair 20. This reduces the cycle time for reading data from the sense amplifier 19.

(4) Second Embodiment

Figure 12:
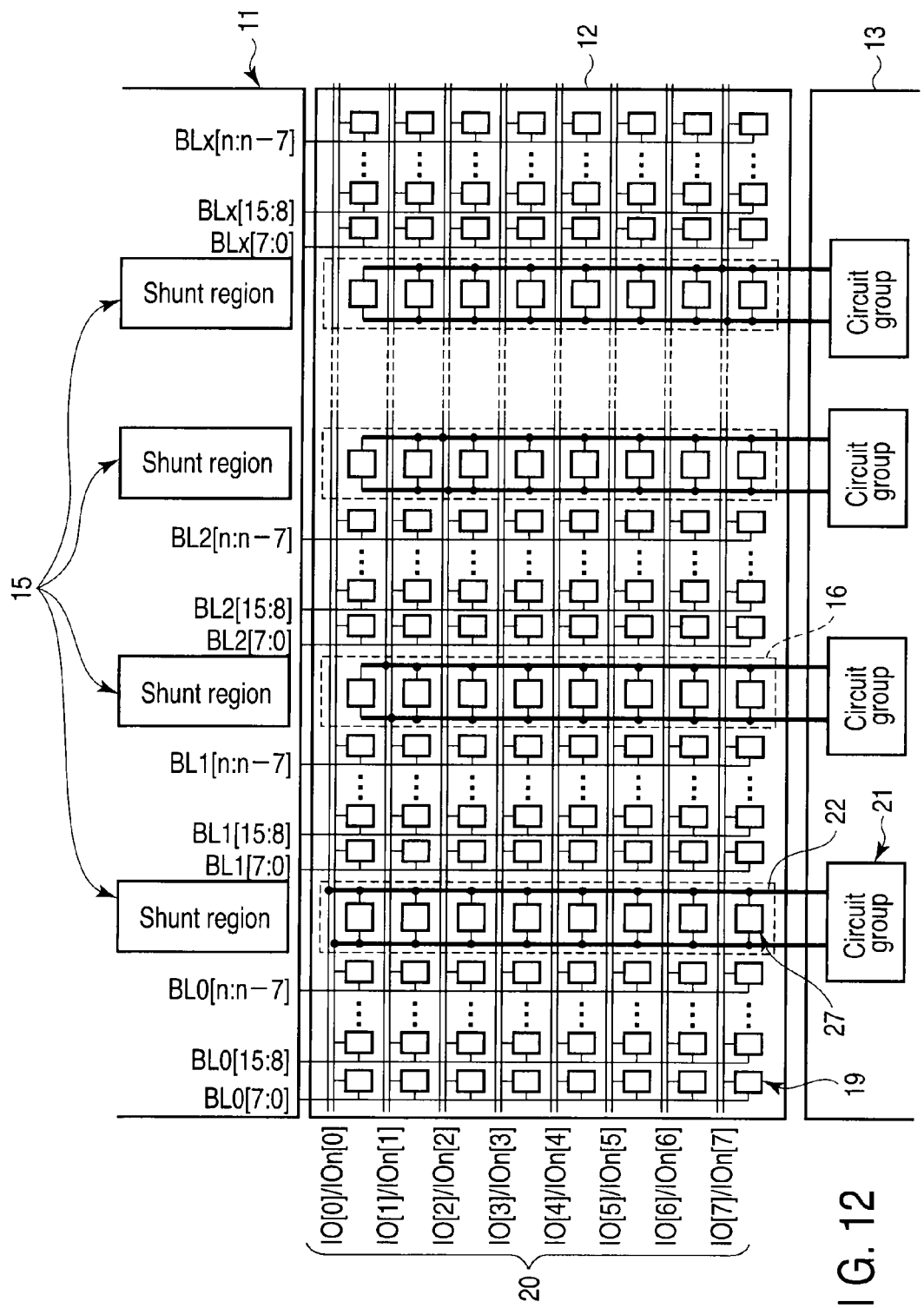
FIG. 12 is a view showing the configuration of the page buffer, memory cell array, and peripheral circuit.

FIG. 12 is a view showing the whole of a page buffer 12 and portions of a memory cell array 11 and peripheral circuit 13 according to the second embodiment.

The second embodiment is the same as the first embodiment in that at least one of a differential amplifier 24, precharger 26, and equalizer 28 formed in a circuit group 21 of the peripheral circuit 13 in the comparative example described previously is formed in a circuit formation portion 27 in a shunt extension region 16 of the page buffer 12.

The second embodiment differs from the first embodiment in that at least one of the differential amplifier 24, precharger 26, and equalizer 28 formed in the circuit formation portion 27 in the shunt extension region 16 is electrically connected to a second data line pair 22.

Since at least one of the differential amplifier 24, precharger 26, and equalizer 28 is formed in the circuit formation portion 27, the distance between the circuit formed in the circuit formation portion 27 and a first data line pair 20 is reduced in this case as well. This makes it possible to suppress the delay of the time during which the amplification of data or precharge propagates to the first data line pair 20.

Also, in the second embodiment, at least one of the differential amplifier 24, precharger 26, and equalizer 28 is formed in the circuit formation portion 27 in the shunt extension region 16, and the circuit formed in the circuit formation portion 27 is electrically connected to the second data line pair 22, as in the first embodiment. Accordingly, the influence of the resistance of the second data line pair 22 can be reduced.

At least one of the differential amplifier 24, precharger 26, and equalizer 28 formed in the circuit formation portion 27 in the shunt extension region 16 is electrically connected to the second data line pair 22. Since this increases the speed of the operation of reading data from a sense amplifier 19, data can be read from the sense amplifier 19 within the read cycle time tRC.

Practical examples of the layout of the circuit formation portion 27 will be explained below.

(A) First Example

In the first example, the precharger 26 and equalizer 28 are formed in the circuit formation portion 27 in all the shunt extension regions 16, and electrically connected to the second data line pair 22. The rest of the circuit is formed in the circuit group of the peripheral circuit 13.

Figure 13:
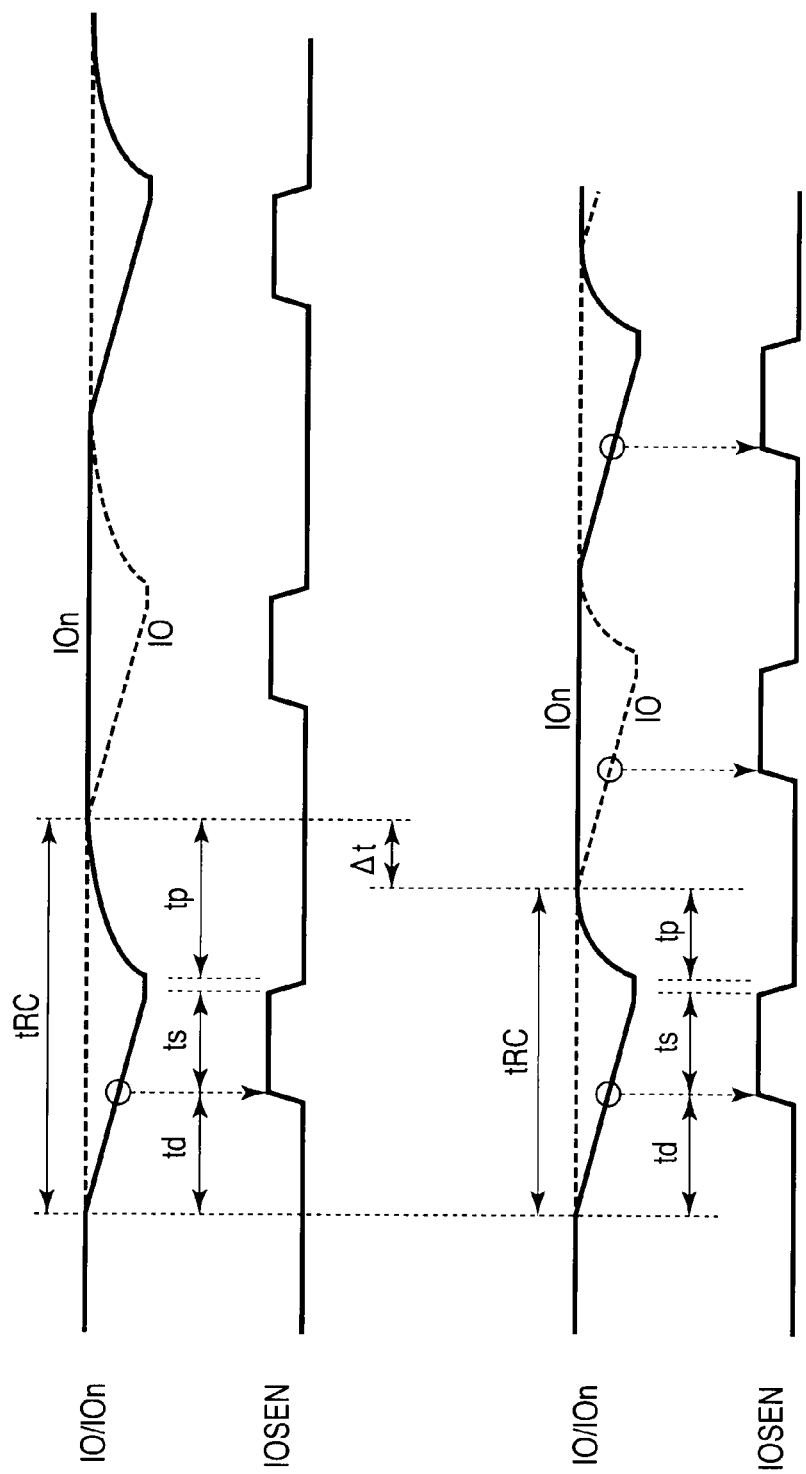
FIGS. 13A and 13B are timing charts of a data line pair.

FIG. 13A is a timing chart for the first data line 20 when forming the precharger 26 and equalizer 28 in the circuit group 21 of the peripheral circuit 13. FIG. 13B is a timing chart for the first data line pair 20 when forming the precharger 26 and equalizer 28 in the circuit formation portion 27 in all the shunt extension regions 16 of the page buffer 12.

As shown in FIGS. 13A and 13B, when forming the precharger 26 and equalizer 28 in the circuit formation portion 27, the precharge time tp is reduced by time Δt compared to that when forming the precharger 26 and equalizer 28 in the circuit group 21.

Also, the precharger 26 is preferably formed in the peripheral circuit 13 in addition to the precharger 26 formed in the shunt extension region 16 of the page buffer 12. By thus forming the prechargers 26 not only in the page buffer 12 but also in the peripheral circuit 13, it is possible to further reduce the influence of the resistance of the second data line pair 22, and further reduce the precharge time.

In this arrangement, a controller 25 performs control such that all the prechargers 26 formed in the shunt extension region 16 and the precharger 26 formed in the peripheral circuit 13 are turned on at the same time the equalizer 28 is turned on. By forming the prechargers 26 not only in the shunt extension region 16 but also in the peripheral circuit 13, the data line pair can be precharged faster than when the data line pair is precharged by one precharger.

(B) Second Example

In the second example, the differential amplifier 24 is formed in the circuit formation portion 27 in all the shunt extension regions 16, and electrically connected to the second data line pair 22. The rest of the circuit is formed in the circuit group 21 of the peripheral circuit 13.

Figure 14:
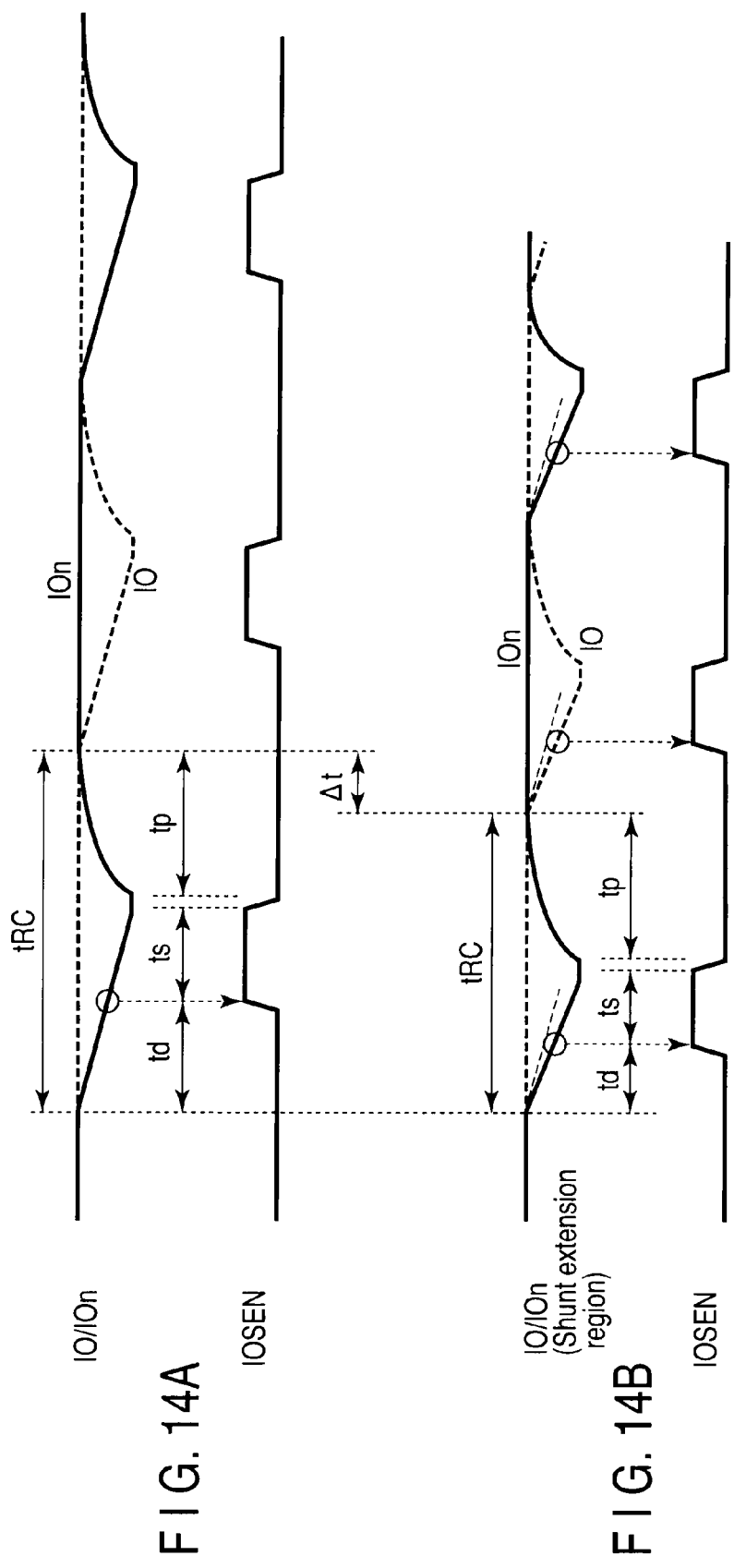
FIGS. 14A and 14B are timing charts of the data line pair.

FIG. 14A is a timing chart for the first data line pair 20 when forming the differential amplifier 24 in the circuit group 21 of the peripheral circuit 13. FIG. 14B is a timing chart for the first data line pair 20 when forming the differential amplifier 24 in the circuit formation portion 27 in the shunt extension region 16 of the page buffer 12.

As shown in FIGS. 14A and 14B, when forming the differential amplifier 24 in the circuit formation portion 27, the data extraction time td and sense time ts are reduced by time Δt compared to those when forming the differential amplifier 24 in the circuit group 21.

Also, since the circuit formation portion 27 is closer to the first data line pair 20 than the circuit group 21, the potential difference between a pair of data lines IO and IOn reaches a desired value at a timing earlier than that shown in FIG. 14A. This makes it possible to advance the timing of an activation signal IOSEN for activating the differential amplifier 24, and reduce the data extraction time td. In addition, the sense time ts is simultaneously reduced because the slope of the data line IO is larger than that shown in FIG. 14A during the amplification period.

Furthermore, the differential amplifier 24 is preferably formed in the peripheral circuit 13 in addition to the differential amplifier 24 formed in the shunt extension region 16 of the page buffer 12. In this arrangement, the controller 25 performs control such that all the differential amplifiers 24 formed in the shunt extension region 16 and the differential amplifier 24 formed in the peripheral circuit 13 are turned on at the same time the precharger 26 and equalizer 28 are turned off. By thus forming the differential amplifiers 24 not only in the shunt extension region 16 but also in the peripheral circuit 13, data read to the data line pair 20 can be amplified faster than when the data is amplified by one differential amplifier.

(C) Third Example

In the third example as shown in FIG. 15, only one of the differential amplifier 24, precharger 26, and equalizer 28 is formed in the circuit formation portion 27 in the shunt extension region 16 with respect to one first data line pair 20.

The embodiment of the present invention is characterized in that one of the differential amplifier 24, precharger 26, and equalizer 28 formed in the circuit group 21 of the peripheral circuit 13 is formed in the circuit formation portion 27 in the shunt extension region 16 of the page buffer 12.

The read cycle time tRC is reduced even when only one of the differential amplifier 24, precharger 26, and equalizer 28 is formed in the shunt extension region 16 with respect to one first data line pair 20.

(D) Summary

As still another example, different types of circuits may also be formed in the circuit formation portions 27 in the shunt extension regions 16. For example, the differential amplifier 24 and precharger 26 are alternately formed in the shunt extension regions 16. In this case, both the sense time and precharge time can be reduced.

In addition, although the equalizer is formed in the second embodiment, it is also possible to form no equalizer.

In the second embodiment, at least one of the differential amplifier 24, precharger 26, and equalizer 28 formed in the circuit group 21 of the peripheral circuit 13 is formed in the circuit formation portion 27 in the shunt extension region 16 of the page buffer 12, and the circuit formed in the circuit formation portion 27 is electrically connected to the second data line pair 22.

Consequently, the distance between the differential amplifier 24, precharger 26, or equalizer 28 and the first data line pair 20 is reduced. Accordingly, it is possible to suppress the delay of the time during which the amplification of a signal or precharge propagates to the first data line pair 20. This reduces the cycle time for reading data from the sense amplifier 19.

3. APPLICATION EXAMPLES

Figure 16B:
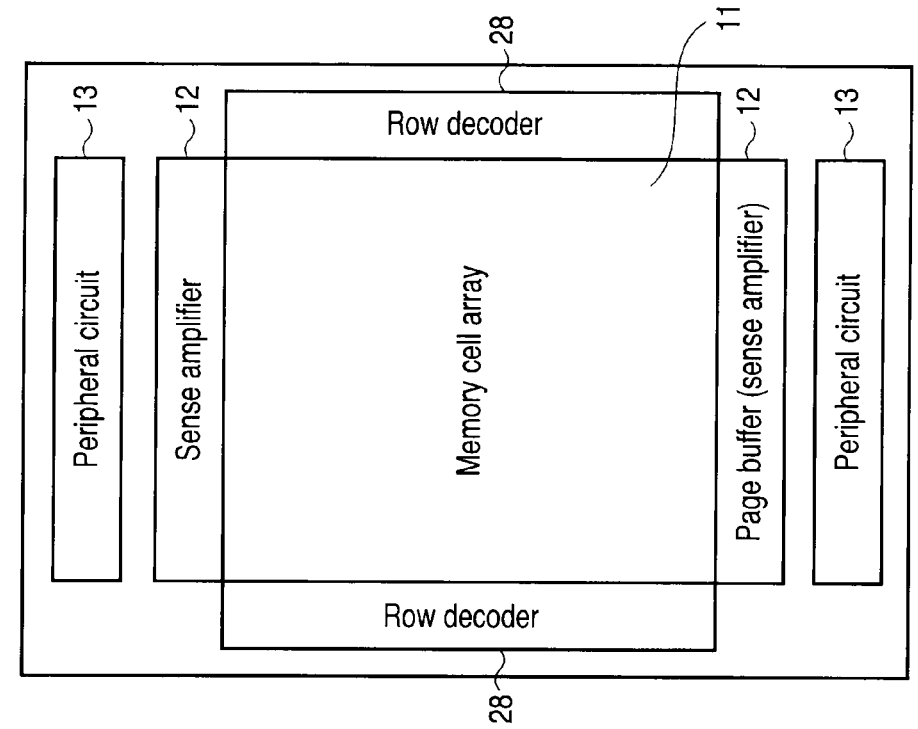
FIGS. 16A and 16B are views each showing the configuration of the page buffer, memory cell array, and peripheral circuit.
Figure 16A:
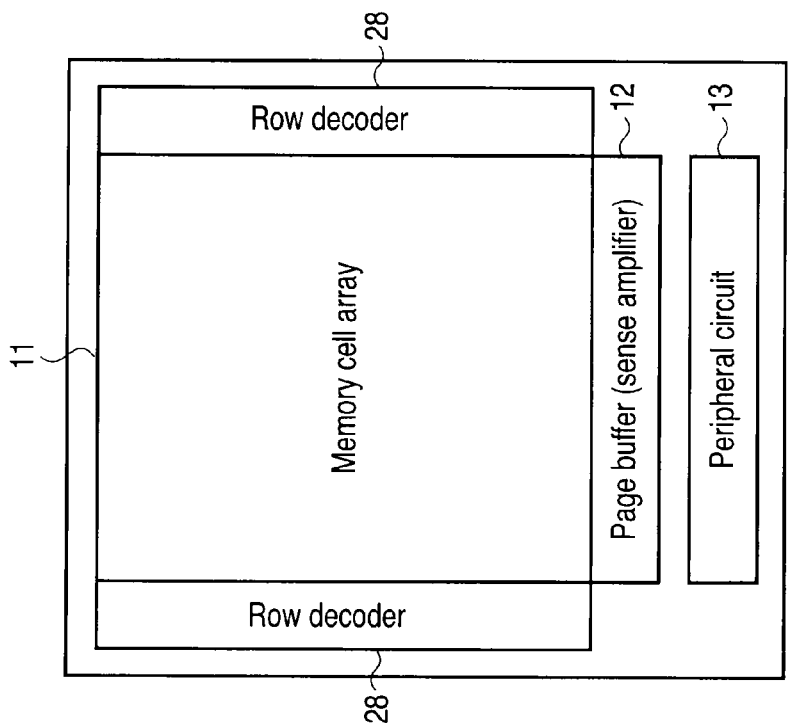

In the above embodiments, one page buffer (sense amplifier) 12 can be formed for the memory cell array 11 as shown in FIG. 16A, or two page buffers (sense amplifiers) 12 can be formed to sandwich the memory cell array 11 as shown in FIG. 16B.

4. CONCLUSION

The embodiments of the present invention propose the techniques capable of reducing the time required to read data from a sense amplifier, and can reduce the time required to read data from a sense amplifier.

The present invention is not limited to the aforementioned embodiments, and can be embodied by modifying the individual constituent elements without departing from the spirit and scope of the invention. Also, various inventions can be constituted by appropriately combining a plurality of constituent elements disclosed in the above embodiments. For example, it is possible to delete some of all the constituent elements disclosed in the above-described embodiments, or appropriately combine the constituent elements of different embodiments.

What is claimed is:

1. A semiconductor memory device comprising:
a memory cell array comprising a plurality of pages in which a plurality of memory cells are arranged;
a page buffer formed adjacent to the memory cell array, and comprising a plurality of sense amplifiers configured to temporarily hold page data read from the memory cells in the page;
a data line pair arranged in the page buffer and connected to the sense amplifiers;
a differential amplifier configured to amplify a potential difference between lines of the data line pair;
a precharger configured to precharge the data line pair to a predetermined potential;
a plurality of shunt regions arranged between the pages along a first direction in the memory cell array, and extending in a second direction perpendicular to the first direction; and
a plurality of shunt extension regions formed in the page buffer by extending the shunt regions in the second direction,
wherein at least one of the differential amplifier and the precharger is formed in the page buffer, and said at least one circuit is electrically connected to the data line pair, and is placed in at least one of the shunt extension regions.

2. The memory device according to claim 1, wherein said at least one circuit is the differential amplifier, and the differential amplifier is placed in at least one of the shunt extension regions.

3. The memory device according to claim 1, wherein said at least one circuit is the precharger, and the precharger is placed in at least one of the shunt extension regions.

4. The memory device according to claim 1, wherein said at least one circuit comprises the differential amplifier and the precharger, and the differential amplifier and the precharger are arranged in at least one of the shunt extension regions.

5. The memory device according to claim 1, wherein at least one of the differential amplifier and the precharger is placed in each of the shunt extension regions, and said at least one circuit is electrically connected to one of the data line pairs.

6. The memory device according to claim 1, further comprising a peripheral circuit formed adjacent to the page buffer, the peripheral circuit comprising a controller configured to control the differential amplifier and the precharger.

7. The memory device according to claim 6, wherein the peripheral circuit comprises a differential amplifier configured to amplify a potential difference between lines of the data line pair, and a precharger configured to precharge the data line pair to a predetermined potential.

8. The memory device according to claim 1, further comprising an equalizer configured to electrically connect lines of the data line pair, the equalizer being placed in at least one of the shunt extension regions.

9. The memory device according to claim 1, wherein when reading data held in the sense amplifier in the page buffer, said at least one of the differential amplifier and the precharger formed in the shunt extension regions is driven.

10. A semiconductor memory device comprising:
a memory cell array comprising a plurality of pages in which a plurality of memory cells are arranged;
a page buffer formed adjacent to the memory cell array, and comprising a plurality of sense amplifiers configured to temporarily hold page data read from the memory cells in the page;
a first data line pair arranged in the page buffer, connected to the sense amplifiers, and running in a first direction;
a second data line pair connected to the first data line pair and running in a second direction perpendicular to the first direction;
a differential amplifier configured to amplify a potential difference between lines of the first data line pair;
a precharger configured to precharge the first data line pair to a predetermined potential;
a plurality of shunt regions arranged between the pages along the first direction in the memory cell array, and extending in the second direction; and
a plurality of shunt extension regions formed in the page buffer by extending the shunt regions in the second direction,
wherein at least one of the differential amplifier and the precharger is formed in the page buffer, and said at least one circuit is electrically connected to the second data line pair, and is placed in at least one of the shunt extension regions.

11. The memory device according to claim 10, wherein said at least one circuit is the differential amplifier, and the differential amplifier is placed in at least one of the shunt extension regions.

12. The memory device according to claim 10, wherein said at least one circuit is the precharger, and the precharger is placed in at least one of the shunt extension regions.

13. The memory device according to claim 10, wherein said at least one circuit comprises the differential amplifier and the precharger, and the differential amplifier and the precharger are arranged in at least one of the shunt extension regions.

14. The memory device according to claim 10, wherein at least one of the differential amplifier and the precharger is placed in each of the plurality of shunt extension regions, and said at least one circuit is electrically connected to one of the second data line pairs.

15. The memory device according to claim 10, further comprising a peripheral circuit formed adjacent to the page buffer, the peripheral circuit comprising a controller configured to control the differential amplifier and the precharger.

16. The memory device according to claim 15, wherein the peripheral circuit comprises a differential amplifier configured to amplify a potential difference between lines of the first data line pair, and a precharger configured to precharge the first data line pair to a predetermined potential.

17. The memory device according to claim 10, further comprising an equalizer configured to electrically connect lines of the first data line pair, the equalizer being placed in at least one of the shunt extension regions.

18. The memory device according to claim 10, wherein when reading data held in the sense amplifier in the page buffer, said at least one of the differential amplifier and the precharger formed in the shunt extension regions is driven.

* * * * *